United States Patent
McCarthy

(10) Patent No.: US 7,271,874 B2
(45) Date of Patent: Sep. 18, 2007

(54) METHOD AND APPARATUS FOR VARIABLE POLARIZATION CONTROL IN A LITHOGRAPHY SYSTEM

(75) Inventor: Matthew McCarthy, Brookfield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/978,367

(22) Filed: Nov. 2, 2004

(65) Prior Publication Data

US 2006/0092398 A1    May 4, 2006

(51) Int. Cl.
*G03B 27/42* (2006.01)
*G03B 27/54* (2006.01)

(52) U.S. Cl. .............. 355/53; 355/67; 355/71
(58) Field of Classification Search ............ 355/53, 355/67, 71
See application file for complete search history.

(56) References Cited

U.S. PATENT DOCUMENTS

| | | | |
|---|---|---|---|
| 3,917,399 A | 11/1975 | Buzawa et al. | |
| 5,144,362 A | 9/1992 | Kamon et al. | |
| 5,436,761 A | 7/1995 | Kamon | |
| 5,442,184 A | 8/1995 | Palmer et al. | |
| 5,467,166 A | 11/1995 | Shiraishi | |
| 5,486,919 A * | 1/1996 | Tsuji et al. | 356/484 |
| 5,537,260 A | 7/1996 | Williamson | |
| 5,539,514 A | 7/1996 | Shishido et al. | |
| 5,541,026 A | 7/1996 | Matsumoto | |
| 5,673,103 A | 9/1997 | Inoue et al. | |
| 5,677,757 A | 10/1997 | Taniguchi et al. | |
| 5,933,219 A | 8/1999 | Unno | |
| 6,108,140 A | 8/2000 | Hashimoto et al. | |
| 6,229,647 B1 | 5/2001 | Takahashi et al. | |
| 6,404,482 B1 * | 6/2002 | Shiraishi | 355/53 |
| 6,483,573 B1 | 11/2002 | Schuster | |
| 6,680,794 B2 | 1/2004 | McClay et al. | |
| 6,819,405 B2 | 11/2004 | Mulkens et al. | |
| 6,970,233 B2 * | 11/2005 | Blatchford | 355/71 |
| 2002/0176166 A1 | 11/2002 | Shuster | |

(Continued)

FOREIGN PATENT DOCUMENTS

EP    1 091 252 A2    4/2001

(Continued)

OTHER PUBLICATIONS

Australian Patent Office Search Report, Appl. No. SG 200508468-6; mailed Apr. 21, 2006.

(Continued)

*Primary Examiner*—D. Rutledge
(74) *Attorney, Agent, or Firm*—Sterne, Kessler, Goldstein & Fox, P.L.L.C.

(57) ABSTRACT

A polarization control device for a lithography system selectively polarizes light in horizontal, vertical and/or circular orientations. A pair of relatively rotatable quarter-wave plates move to provide the desired polarization. When the quarter-wave plates are at a relative angle of 45 degrees, the polarization is circular. When the quarter-wave plates are both at zero or 45 degrees, the resulting polarization is vertical or horizontal. The polarization is selected based on the orientation of an image to be projected. Horizontal polarization is preferably used for images with a strong horizontal orientation, and vertical polarization is selected for images with a strong vertical orientation. Circular orientation is selected when the image has no strong horizontal or vertical orientation.

19 Claims, 5 Drawing Sheets

U.S. PATENT DOCUMENTS

| | | | |
|---|---|---|---|
| 2004/0150821 A1* | 8/2004 | Shibata et al. | 356/369 |
| 2004/0245439 A1 | 12/2004 | Shaver | |
| 2005/0052634 A1* | 3/2005 | Sugihara et al. | 355/55 |
| 2005/0078293 A1 | 4/2005 | Mackey et al. | |

FOREIGN PATENT DOCUMENTS

| | | |
|---|---|---|
| JP | 64-50602 | 2/1989 |
| JP | 07-142334 | 6/1995 |
| JP | 8-203806 | 8/1996 |
| KR | 2003-6953 | 1/1998 |
| KR | 137348 | 2/1998 |
| WO | WO 01/22164 A1 | 3/2001 |

OTHER PUBLICATIONS

"Understanding the Forbidden Pitch Phenomenon and Assist Feature Placement," Shi et al., SPIE vol. 4689: 985-996 (2002).

"Forbidden Pitches for 130nm Lithography and Below," Socha et al., SPIE vol. 4000: 1140-1155 (2000).

"Resolution Enhancement Techniques in Optical Lithography", A. K. Wong, SPIE Press, pp. 28-29, (Mar. 2001).

"Impact of Illumination Coherence and Polarization on the Imaging of Attenuated Phase Shift Masks," Ma et al., SPIE vol. 4346: 1522-1532 (2001).

"Solutions for Printing Sub 100nm Contacts with ArF," Graupner et al., SPIE vol. 4691: 503-514 (2002).

"The Vortex Via Mask: Making 80nm Contacts With A Twist!," Levenson et al., SPIE vol. 4889 (2002).

"Overcoming the Resolution Challenge Using Special Illumination Techniques to Print 50/50 nm Nested Contact Holes at 157 nm Wavelength," Baba-Ali et al., SPIE vol. 5040: 1352-1363 (2003).

* cited by examiner

METHOD AND APPARATUS FOR VARIABLE POLARIZATION CONTROL IN A LITHOGRAPHY SYSTEM

BACKGROUND OF THE INVENTION

1. Field of the Invention

The present invention is generally related to lithography systems, and more particularly, to polarization of light in a lithography system.

2. Background Art

Lithography is a process used to create features on a surface of a substrate. The substrate can include those used in the manufacture of flat panel displays, circuit boards, various integrated circuits, print heads, micro/nano fluidic devices and the like. A semiconductor wafer, for example, can be used as a substrate to fabricate an integrated circuit.

In an exemplary lithography process, an image, often formed on a reticle, is used to transfer a desired pattern onto a substrate. During lithography, a wafer, which is disposed on a wafer stage, is exposed to an image projected onto the surface of the wafer corresponding to the desired image pattern.

The projected image produces changes in the characteristics of a layer, for example a resist layer, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or otherwise process exposed portions of underlying structural layers within the wafer, such as conductive, semiconductive, or insulating layers. This process is then repeated, together with other steps, until the desired features have been formed on the surface of the wafer.

Lithographic processes are used to produce increasingly complex devices at an increased level of miniaturization. Lithography systems can be described in terms of their numerical aperture (NA) and the NA of systems is increased to facilitate production of more densely populated devices. In very high NA lithography, the capacity of the process will be limited by the available level of imaging accuracy. Systems that can project an image with higher optical efficiency and higher contrast levels can produce more highly integrated devices in high-NA lithography.

Thus, there is a need for an improved apparatus and method for increasing optical efficiency and contrast levels in a lithography system.

BRIEF SUMMARY OF THE INVENTION

The present invention relates generally to improved polarization control optics. The invention is defined by the claims appended to the patent, and is not limited by the examples used to disclose the invention.

In one preferred embodiment of the invention disclosed herein, a polarization control device is provided in a lithography system, allowing selective polarization of light in horizontal, vertical and/or circular orientations. The polarization control device includes a pair of quarter-wave plates capable of rotation with respect to each other and the incoming polarization. When the angles of the quarter wave plate axes are at (0°, 45°) to the incoming linear polarization, the output polarization is circular. When the angles of the quarter wave plate axes are at (0°, 0°), the output is linear parallel to the incoming polarization. When the angles of the quarter wave plate axes are at (45°, 45°) the output is linear orthogonal to the incoming polarization.

The inventor has discovered that increased optical efficiency can be obtained by selecting a polarization based on the orientation of the image to be projected. Horizontal polarization is preferably used for images with a strong horizontal orientation, and vertical polarization is selected for images with a strong vertical orientation. Circular orientation is selected when the image has no strong horizontal or vertical orientation.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
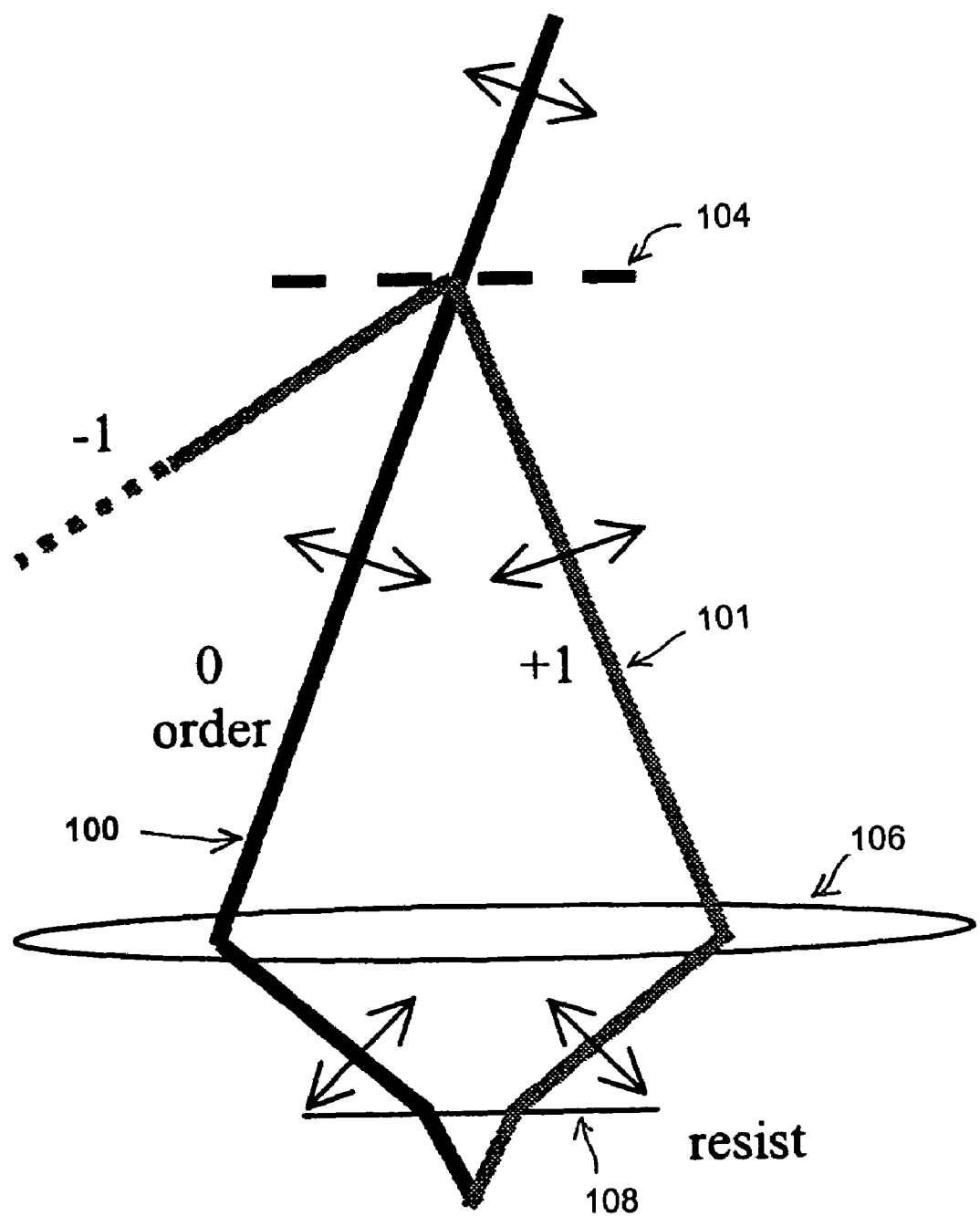
FIG. 1A is an optical path diagram showing an arrangement with a diffraction angle that produces non-parallel electric fields.

The present invention will now be described with reference to the accompanying drawings. In the drawings, some like reference numbers indicate identical or functionally similar elements. Additionally, the left-most digit(s) of most reference numbers identify the drawing in which the reference numbers first appear.

DETAILED DESCRIPTION OF SELECTED EMBODIMENTS OF THE INVENTION

Embodiments of the present invention provide, among other things, an improved polarization system and method useful in high-precision lithography. Exemplary embodiments will now be described in detail with reference to the drawings, starting with FIGS. 1A and 1B.

In a high-precision lithography system, an image is projected onto a resist material. The amount of interference generating this image determines the level of contrast. In particular, a higher percentage of interfering light will produce greater contrast. Light interferes only when it is coherent and the electric fields are parallel. Therefore, components whose vibration energies are parallel provide greater contrast. The orientation of the polarization vector in lithography systems therefore determines contrast and affects the performance of the system.

Figure 1B:
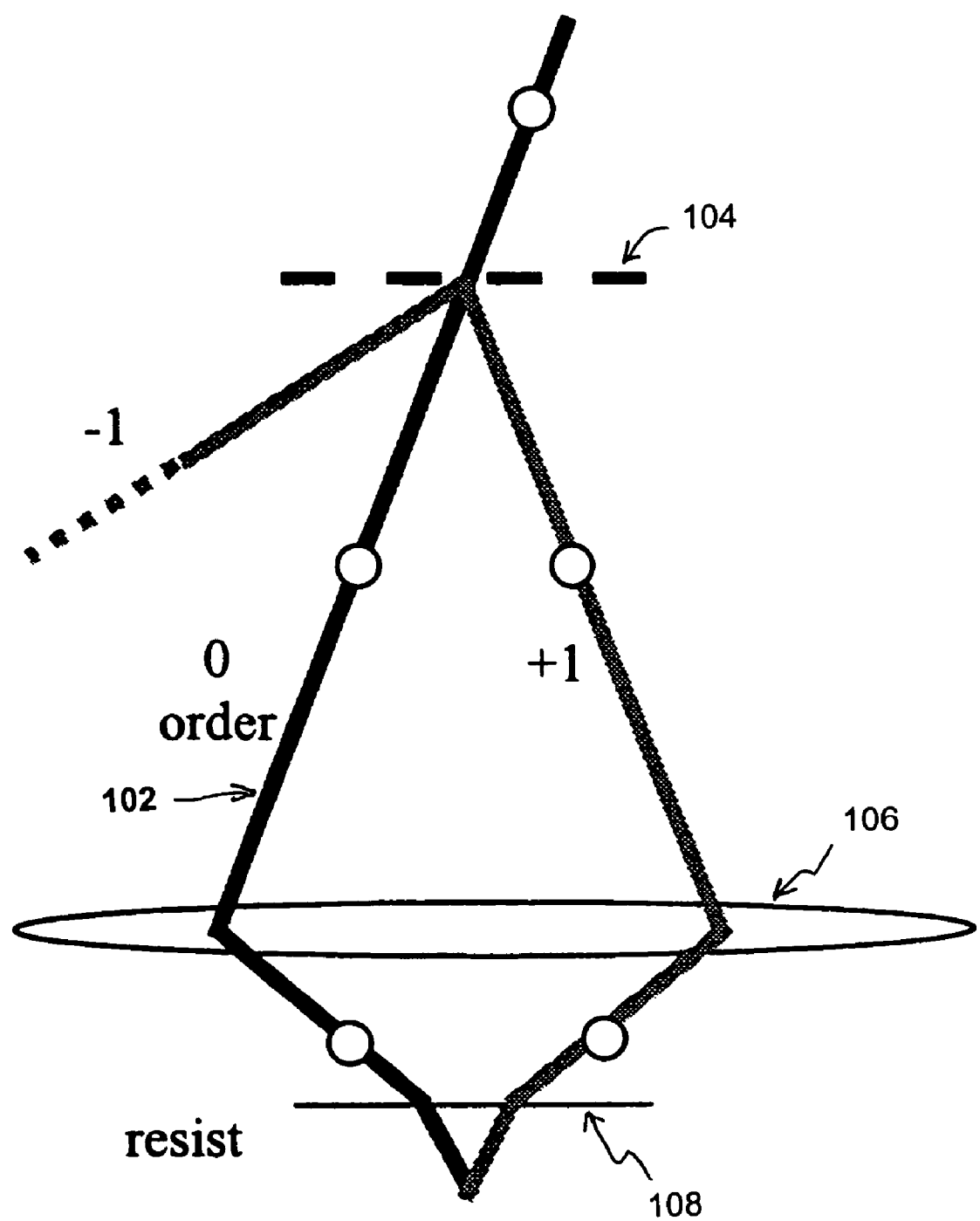
FIG. 1B is an optical path diagram showing an arrangement with a parallel electric field, having improved contrast relative to the arrangement of FIG. 1A.

FIGS. 1A and 1B illustrate the effect of these factors on imaging in a lithography system. FIG. 1A shows an optical path arrangement that produces a relatively lower contrast image. As light passes through an object 104 (for example, a reticle), the light is diffracted to produce 0, −1 and +1 order paths as shown. The 0 order beam in path 100 and the +1 order beam in path 101 are collected by objective lens 106 and focused on resist 108. Without optimal polarization, the electric fields at the resist in diffraction paths 100 and 101, as indicated by arrows, are not parallel. In FIG. 1B, the electric field is oriented into and out of the page. The field is thus parallel for the zero order beam along path 102 and the +1 order beam along path 103, which are then collected by objective lens 106 and focused on resist 108. The circles shown in the light beam represent arrows coming out of the page to indicate the electric field. Because the fields have been oriented so that they are parallel for the plural diffraction paths, FIG. 1B has improved image contrast relative to the arrangement of FIG. 1A.

In one preferred embodiment of the invention, a novel polarization control approach improves image contrast at the wafer by increasing the level of interference. The level of interference is selected to achieve optimal image contrast for the type of image projected. In one embodiment, at the extreme, the object and illumination may be chosen so that the image formation is equivalent to a two-beam interference, although the invention is not limited to this embodiment.

Figure 2:
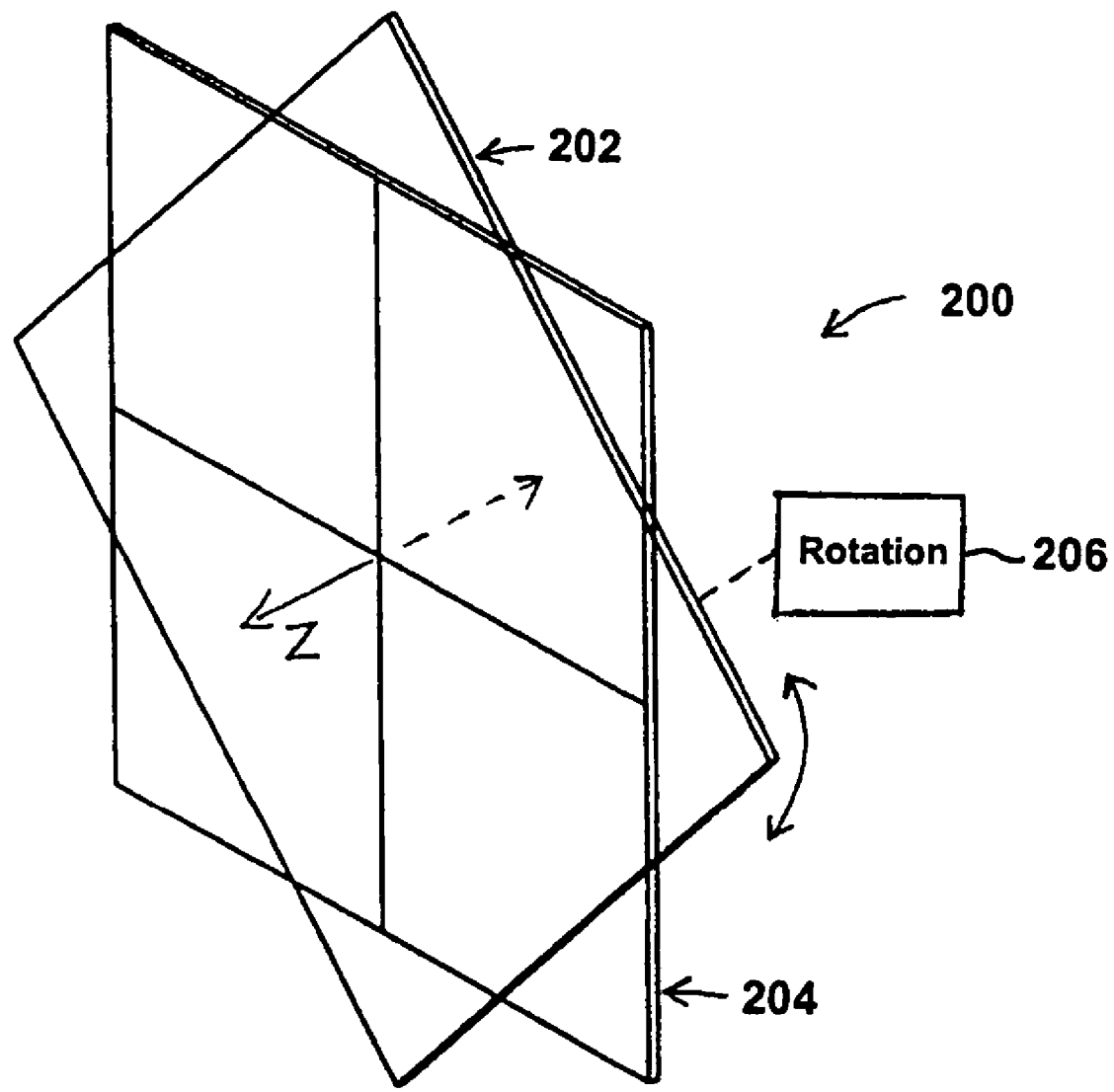
FIG. 2 shows an arrangement of two relatively rotatable quarter-wave plates used in an embodiment of the invention.

An exemplary embodiment of an apparatus used in the invention is shown in FIG. 2. In this embodiment, contrast in a lithography system is enhanced by adding a means for polarization control in the form of a polarization control device 200. Polarization control device 200 may consist of one or more active electronically controlled devices capable of variable polarization, or may consist of one or more passive polarizing optical elements.

In an exemplary embodiment using passive elements, polarization control device 200 includes two quarter wave plates 202 and 204 with independently variable rotation. Variable orientation is provided, for example, by making at least one and preferably both of the plates 202 and 204 movable. In the example shown in FIG. 2, plates 202 and 204 can both be rotated about the Z-axis central to plates 202 and 204.

A movement mechanism 206 for moving plates 202 and 204 is shown only generally in FIG. 2, since the details of this mechanism are not critical to the invention. What is important is that there is some means for varying the polarizing effect of the combination of plates 202 and 204. In the example provided, both of the plates may be rotated. Any device for rotating an optical element can be used for this purpose. For example, in one simple embodiment, a circular gear track with a manual or motorized drive is provided to selectively rotate plates 202 and 204 about the Z-axis. In other embodiments, solenoids or other electromechanical movement devices can be used to index one or both of the plates into the desired relative positions. Those skilled in the field will recognize that movement of optical elements to obtain a desired positioning and orientation in an optical path is a well-established art, and that any device used to rotate optical elements, whether already known or to be developed in the future, might be used within the scope of the invention.

Quarter-wave plates 202 and 204 are preferably formed from stressed fused silica. This material is rendered birefringent by stress loads placed on the material. The light associated with the larger index of refraction is retarded by 90° in phase (a quarter wavelength) with respect to that associated with the smaller index. The plates are formed so that the optic axis is parallel to the front and back plates of the plate. All light striking the plate will be divided into two components with different indices of refraction, except in the case of linearly polarized light parallel to the axis of the birefringence.

It should be understood that the invention is not limited to any particular structure or formation method of the quarter-wave plates, and any plates or other optical elements having appropriate optical properties may be substituted for the quarter-wave plates described herein.

Figure 3:
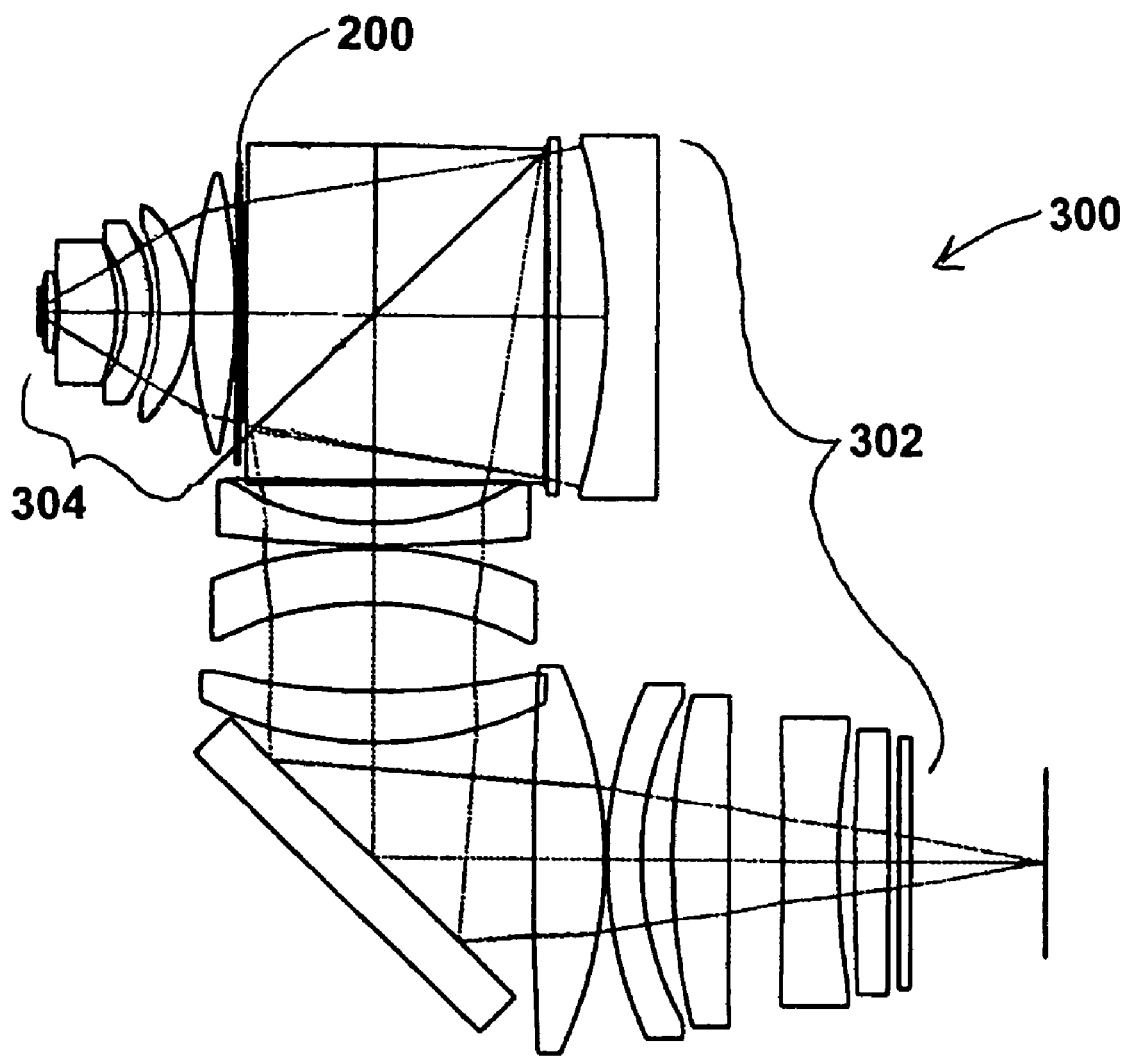
FIG. 3 is a top view of an embodiment of the invention where a lithographic optical unit is provided with the quarter-wave plates of FIG. 2 in its final stage.

FIG. 3 shows polarization control device 200 (shown in FIG. 2) installed in a lens system 300 of a lithography system. Lens system 300 may be, for example, the lens system of any high NA lithography system manufactured by ASML of Wilton, Conn. In this example, lens system 300 comprises a first optical stage 302 and a second optical stage 304. Polarization control device 200, which in the example used herein includes two quarter-wave plates, is installed between first optical stage 302 and second optical stage 304. Polarization control device 200 replaces a single quarter wave plate that would be present at the same location in a more conventional lithography lens system.

The orientation of the quarter wave plates in polarization control device 200 is preferably varied depending on the geometries being imaged. In a preferred embodiment of the invention, the quarter-wave plates are used to selectively create a horizontal, vertical, or circular polarization depending on image geometry. In general, for horizontally-oriented images, horizontal linear polarization will enhance contrast. For vertically-oriented images, vertical linear polarization is desirable. If the object is not either horizontal or vertical, circular polarization is preferred.

By horizontally-oriented image, the inventor means an image that has strong horizontal elements, such as many horizontally oriented traces, and vertical elements that are noticeable less numerous and prominent compared to the horizontal elements. A vertically-oriented image is the opposite, having strong vertical linear elements and less prominent horizontal elements. Those skilled in the art will be able to determine whether an image is primarily horizontally or vertically oriented on inspection. If for some reason it is difficult to determine the orientation of an image, the orientation can be determined experimentally by testing the image with the three available polarizations (horizontal, vertical, and circular) and determining which polarization produces the best lithography result.

The present invention operates independently of the method selected for providing a lithographic pattern, or image, in the optical path. In particular, the present invention can be used with any type of lithography system. In traditional lithography systems, a lithographic pattern mask is formed on a reticle substrate and light passes through the mask to create a projected image on the surface of the element being formed. Maskless lithography systems have also been developed. Maskless systems may use various components, including for example active devices, spatial light modulators, liquid crystal devices, and/or various reflective devices, to selectively block light to create a lithographic pattern between the light source and the surface on which the pattern is to be projected. The polarization features of the present invention are applicable to any lithography process, including mask and maskless processes.

When the input light is linearly polarized horizontal, and horizontal polarization is desired, the quarter-wave plates 202 and 204 are oriented to provide a linear polarization in the horizontal orientation (for example, by arranging quarter wave plates 202 and 204 at a zero degree angle with the optical axis). In this orientation, the polarizing features of the two quarter-wave plates 202 and 204 are aligned and the assembly does not significantly retard light passing therethrough. When vertical polarization is desired, the quarter-wave plates 202 and 204 are oriented to provide a linear polarization in the vertical orientation (for example, by rotating both quarter wave plates 202 and 204 to a 45 degree angle with the optical axis). In this mode, the polarizing features of quarter-wave plates 202 and 204 are oriented so that the assembly acts as a half-wave retarder.

The horizontal, vertical and circular polarizations described in this example require only three discrete settings for two quarter waveplates. Additional settings for the device will allowed additional polarization states. For example with a 0° and 45° (relative to incoming linearly polarized light) setting available for the first quarter waveplate, a linear polarization can be generated for every available adjustment angle for the second quarter waveplate.

The designations of "horizontal" and "vertical" used herein are arbitrary and under some circumstance may be interchanged. That is, either direction may be designated as the "horizontal" direction, as long as the orientation of the device optics, the quarter wave plates, and the image to be projected are consistent with that designation. The other available polarization orientation, typically orthogonal to the designated horizontal direction, will be designated as the vertical direction. It will also be understood that the designations of zero and 45 degrees for the position of quarter-wave plate 202 are relative designations. A variety of angular positions of the quarter-wave plates 202 and 204 are possible depending on the orientation of the other elements of the system, and depending on the frame of reference. In the embodiment disclosed, the system produces a polarization designated as horizontal at a first quarter-wave plate orientation (designated in the example as 0 degrees) and a polarization designated as vertical at a second quarter-wave plate orientation (designed in the example as 45 degrees).

Typically the position of quarter-wave plate 202 for a horizontal polarization will be 45 degrees from its position for a vertical polarization. However, the invention is not so limited and in some embodiments within the scope of the invention the nominally horizontal and vertical positions may have different orientations.

When circular polarization is desired, quarter-wave plates 202 and 204 are oriented to act in combination as a quarter wave retarder, converting linearly polarized light to circularly polarized light. In this mode, quarter wave plate 202 is oriented at approximately a 45° angle with the optical axis while quarter wave plate 204 is oriented at zero degrees. The incident light passes through both quarter-wave plates 202 and 204 and due to their relative orientation, o- and e-waves are produced with equal amplitude, but the o-wave falls behind by 90° in phase, producing circularly polarized light.

It is possible to control polarization by providing a polarization control device in various locations within the optics of a lithography system. The scope of the invention includes controlling polarization with a polarizing device at any desired location between the light source and the surface being processed. For example, the polarizing device may be located in the projection optics, in the mechanism of the illumination source, or even between the lithographic pattern and the surface being processed, although such positioning is less preferred. In a preferred embodiment, the polarization control is located in the projection optics. Within the projection optics, polarization can be performed more easily in a region where the light is more collimated, before final magnification.

Figure 4:
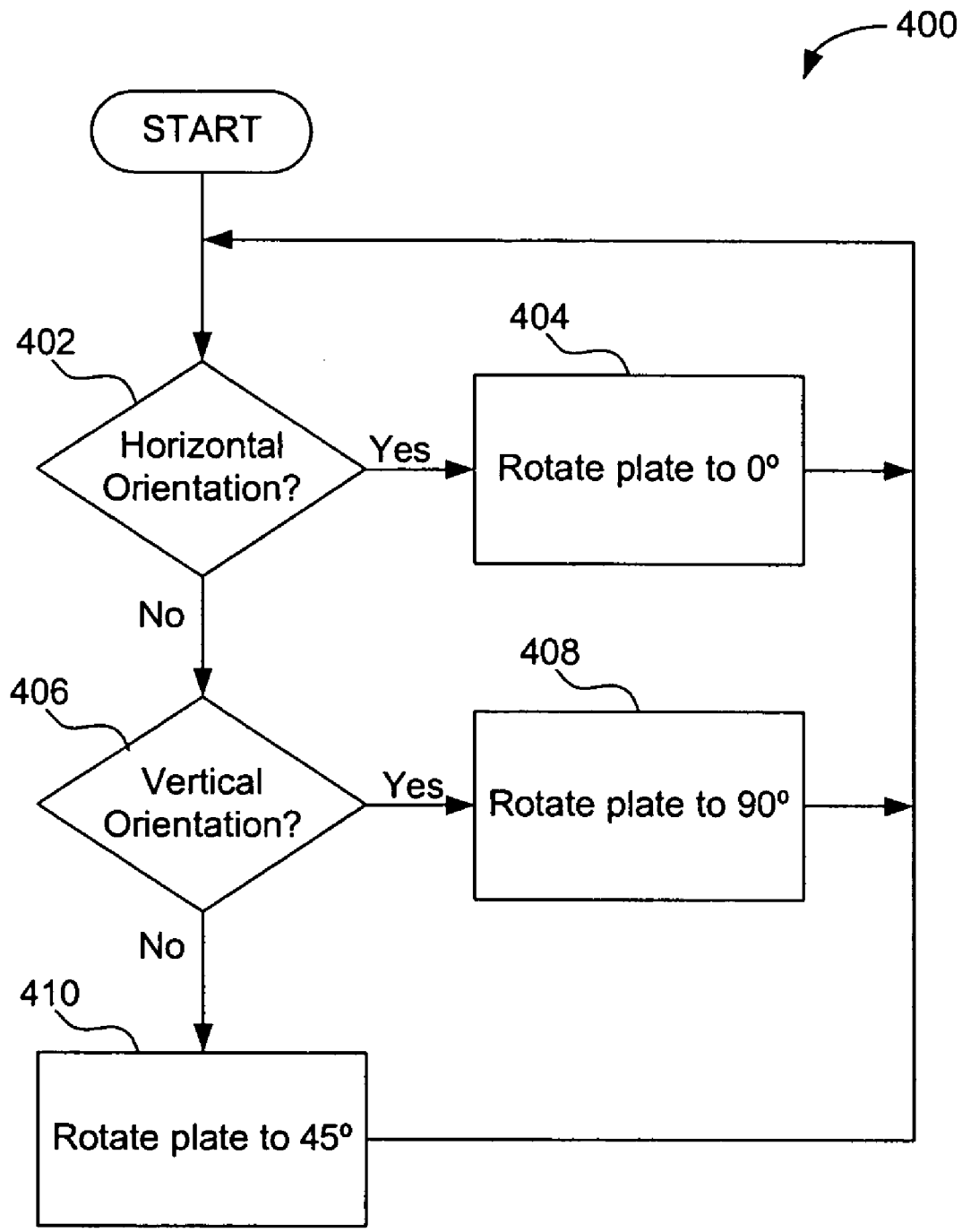
FIG. 4 is a flow chart showing a process for selectively varying polarization of the optical output in a lithography machine.

A preferred method of selecting an optimal polarization will now be described in more detail with reference to FIG. 4. FIG. 4 shows a polarization selection process 400 in which the input polarization is assumed to be linear horizontal. Process 400 starts with step 402, where it is determined whether or not the image of interest has a primarily horizontal orientation. If so, control passes to step 404, and the quarter wave plates are both positioned at zero degrees to provide a horizontal polarization. Then the lithography process is performed, and process 400 is restarted for the next image to be processed.

If the orientation is not horizontal, control passes to step 406. In step 406, the process determines whether or not the image has a primarily vertical orientation. If there is a primarily vertical orientation, control passes to step 408, and the movable quarter-wave plates are both rotated to a 45 degree position. After the lithography process is performed, process 400 is restarted for the next image to be processed.

If during execution of step 406 it is determined that the orientation is not vertical, then the orientation is neither strongly horizontal nor strongly vertical. In this case, the preferred polarization is circular, and control passes to step 410 where one quarter-wave plate is rotated to a 45 degree orientation relative to the other, producing a circular polarizing arrangement. Once the lithography process is complete, process 400 begins again to determine polarization for the next image to be processed.

In process 400, the determination of whether the image has horizontal direction, vertical direction, or a direction that is not strongly vertical or horizontal, can be achieved by inspection of the image, or may be obtained automatically through electronic image processing. In particular, the image may be digitized and processed by a computing device to determine whether the linear elements of the image are primarily oriented horizontally, vertically, or neither horizontally nor vertically.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithography system for patterning light from a light source with a pattern and projecting the patterned light onto a surface, comprising:
   an illumination system that supplies the light;
   a patterning device that patterns the beam according to the pattern;
   a projection system that projects the patterned beam onto a target portion of the surface of a substrate;
   a variable polarizing element, having first and second quarter wave plates, located between the illumination system and the surface; and
   a rotation device configured to create a relative rotational movement between said first and second quarter wave plates,
   wherein said variable polarizing element is configured to operate in one of a mode selected from the set of: a first linear polarization direction, a second linear polarization direction orthogonal to said first linear polarization direction, and a circular polarization.

2. The system of claim 1, wherein said variable polarizing element selectively operates in at least three polarizing modes.

3. The system of claim 2, wherein said at least three modes include horizontal polarization, vertical polarization, and circular polarization.

4. The system of claim 1, further comprising a motor drivingly connected to at least one of said first and second quarter wave plates.

5. The system of claim 1, wherein said rotation device further comprises a positioning device that selectively positions said first and second quarter wave plates in one of at least three positions, so that the combination of said first and second quarter wave plates operates as a non-retarder, a quarter wave retarder, or a half wave retarder according to a selected one of said at least three positions.

6. The system of claim 1, wherein said rotation device comprises an electromechanical actuating device.

7. The system of claim 1, wherein said rotation device positions said first and second quarter wave plates in a predetermined relationship to create a polarization consistent with an orientation of the pattern.

8. The system of claim 1, wherein said mode of said variable polarizing element is selected based on an orientation of the pattern.

9. The system of claim 8, wherein said variable polarizing element produces a first polarization direction when the pattern is predominantly oriented along said first polarization direction, and produces a second polarization direction different from said first polarization direction when the pattern is predominantly oriented along said second polarization direction.

10. The system of claim 9, wherein said first polarization direction is orthogonal to said second polarization direction.

11. A method for operating a lithography system, comprising the steps of:
    patterning a beam of radiation based on a pattern;
    projecting the patterned beam onto a target portion of a substrate; and
    positioning first and a second quarter wave plates of a variable polarizing element relative to each other based on features of the pattern to polarize the beam, wherein the variable polarizing element is operable in one of at least two modes selected from the set of: a first linear polarization direction, a second linear polarization direction orthogonal to said first linear polarization direction, and a circular polarization.

12. The method of claim 11, wherein in said polarizing step, said variable polarizing element selectively operates in at least three polarizing modes.

13. The method of claim 12, wherein said at least three modes include horizontal polarization, vertical polarization, and circular polarization.

14. The method of claim 11, wherein said step of relatively positioning said first and second quarter wave plates comprises the step of driving said first quarter wave plate with an electromechanical device to selectively move said first quarter wave plate relative to said second quarter wave plate.

15. The method of claim 14, wherein said step of relatively positioning said first and second quarter wave plates further comprises the step of selectively positioning said first and second quarter wave plates in one of at least three positions, so that the combination of said first and second wave plates operates as a non-retarder, a quarter wave retarder, or a half wave retarder depending on said one of said three positions.

16. The method of claim 11, wherein said desired relative position is selected to create a polarization consistent with an orientation of the pattern.

17. The method of claim 11, comprising the further step of selecting said mode of said variable polarizing element based on an orientation of the pattern.

18. The method of claim 17, wherein in said step of selecting said mode, a first polarization direction is selected when the pattern is predominantly oriented along said first polarization direction, and a second polarization direction different from said first polarization direction is selected when the pattern is predominantly oriented along said second polarization direction.

19. The method of claim 18 wherein said first polarization direction is orthogonal to said second polarization direction.

* * * * *